(12) United States Patent
Tseng et al.

(10) Patent No.: US 10,859,908 B2
(45) Date of Patent: *Dec. 8, 2020

(54) METHOD TO FABRICATE MASK-PELLICLE SYSTEM

(71) Applicant: Taiwan Semiconductor Manufacturing Company Ltd., Hsinchu (TW)

(72) Inventors: Chun-Hao Tseng, Taichung (TW); Sheng-Chi Chin, Hsinchu (TW); Yuan-Chih Chu, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 245 days.

This patent is subject to a terminal disclaimer.

(21) Appl. No.: 15/829,814

(22) Filed: Dec. 1, 2017

(65) Prior Publication Data

US 2018/0088459 A1    Mar. 29, 2018

Related U.S. Application Data

(63) Continuation of application No. 14/859,136, filed on Sep. 18, 2015, now Pat. No. 9,835,940.

(51) Int. Cl.
*G03F 1/62* (2012.01)
*G03F 1/64* (2012.01)
*B05D 1/00* (2006.01)

(52) U.S. Cl.
CPC .............. *G03F 1/64* (2013.01); *B05D 1/005* (2013.01); *G03F 1/62* (2013.01)

(58) Field of Classification Search
CPC ................. G03F 1/62; G03F 1/64; G03F 1/24

USPC ............................................................ 430/5
See application file for complete search history.

(56) References Cited

U.S. PATENT DOCUMENTS

| 6,623,893 | B1 | 9/2003 | Levinson et al. |
| 7,355,680 | B2 | 4/2008 | Gallagher et al. |
| 7,826,038 | B2 | 11/2010 | Gallagher et al. |
| 7,951,513 | B2 | 5/2011 | Kubota et al. |
| 8,628,897 | B1 | 1/2014 | Lu et al. |
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,753,788 | B1 | 6/2014 | Yu et al. |
| 8,764,995 | B2 | 7/2014 | Chang et al. |
| 8,765,330 | B2 | 7/2014 | Shih et al. |

(Continued)

FOREIGN PATENT DOCUMENTS

| CN | 101414118 | 4/2009 |
| CN | 105629656 A | 6/2016 |

OTHER PUBLICATIONS

U.S. Appl. No. 14/736,669, filed Jun. 11, 2015, entitled "EUV Mask and Manufacturing Method by Using the Same", Chih-Tsung Shih, 25 pp.

*Primary Examiner* — John A McPherson
(74) *Attorney, Agent, or Firm* — Haynes and Boone, LLP

(57) ABSTRACT

A method for fabricating a pellicle assembly for a lithography process includes providing a carrier. A membrane layer is fabricated over the carrier. A pellicle frame is attached to the membrane layer. The carrier is then separated from the membrane layer using a release treatment process.

20 Claims, 16 Drawing Sheets

(56) References Cited

U.S. PATENT DOCUMENTS

| | | |
|---|---|---|
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,871,609 B2 | 10/2014 | Yu et al. |
| 8,877,409 B2 | 11/2014 | Hsu et al. |
| 9,305,769 B2 | 4/2016 | Yu et al. |
| 9,547,232 B2 | 1/2017 | Levinson et al. |
| 9,606,459 B2 | 3/2017 | Lairson et al. |
| 9,835,940 B2 * | 12/2017 | Tseng .................. G03F 1/64 |
| 2005/0042524 A1 * | 2/2005 | Bellman ................ C23C 26/00 430/5 |
| 2016/0139500 A1 * | 5/2016 | Kim ..................... G03F 1/62 430/5 |
| 2017/0038676 A1 | 2/2017 | Jung et al. |
| 2017/0090279 A1 * | 3/2017 | Ono ..................... G03F 1/62 |
| 2018/0284598 A1 * | 10/2018 | Schnieders ............ G03F 1/62 |

* cited by examiner

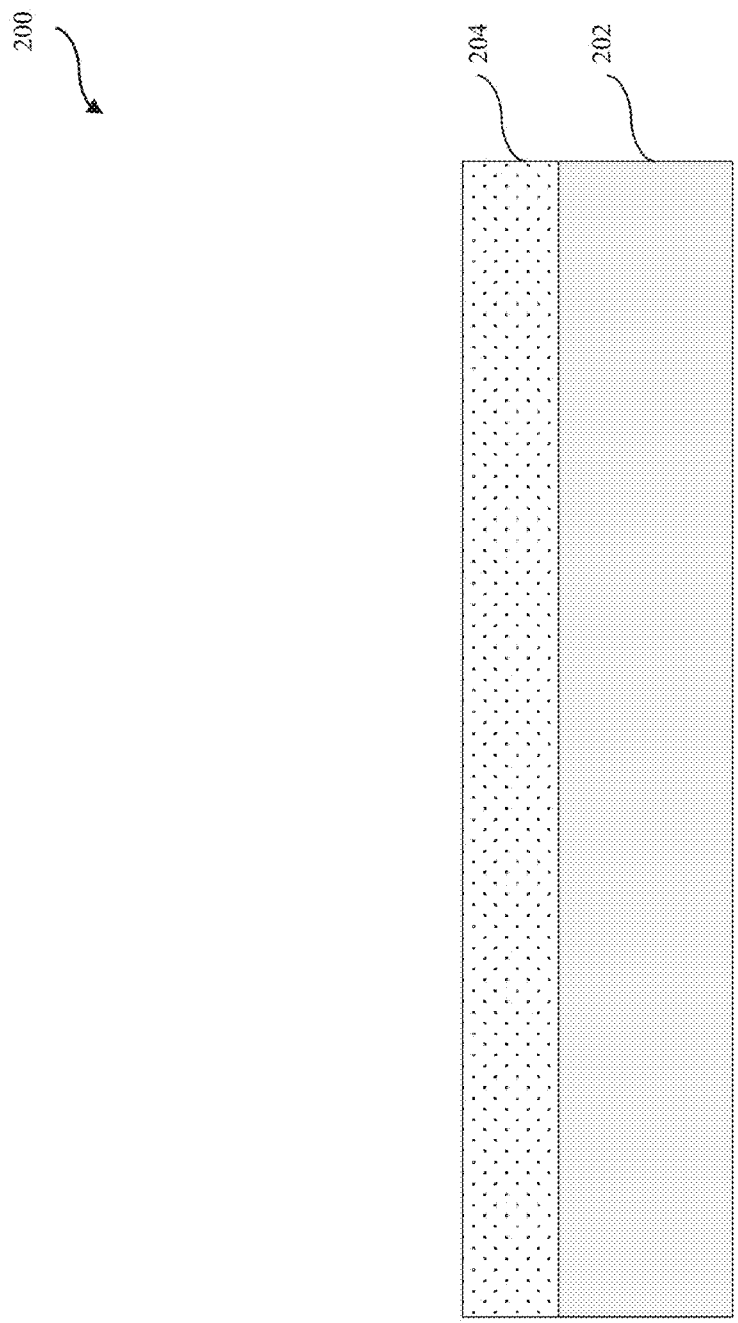

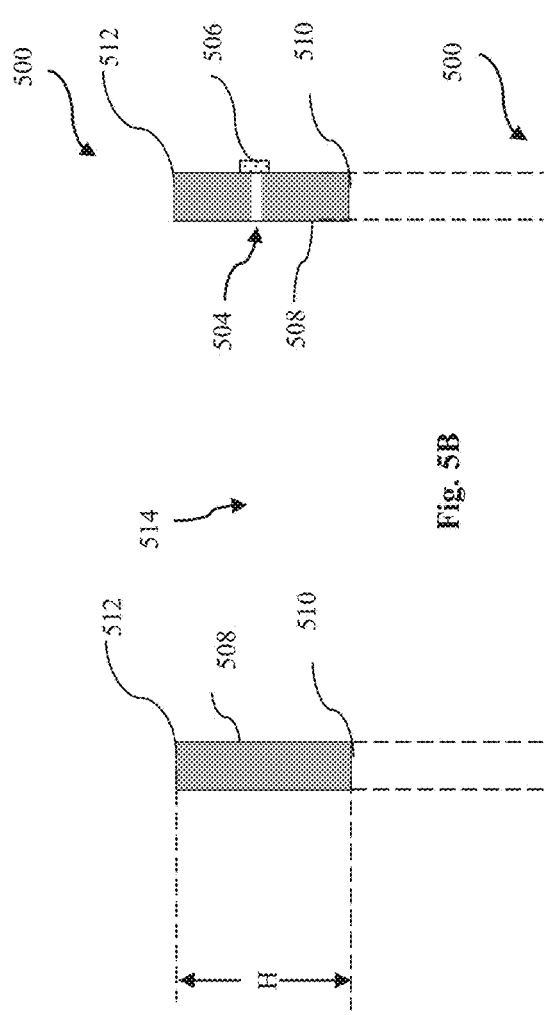
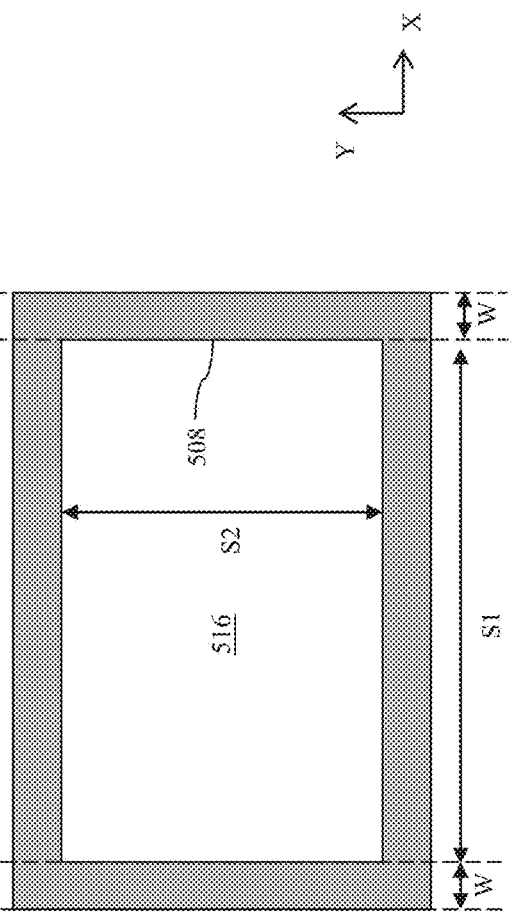
Fig. 5B
Fig. 5C

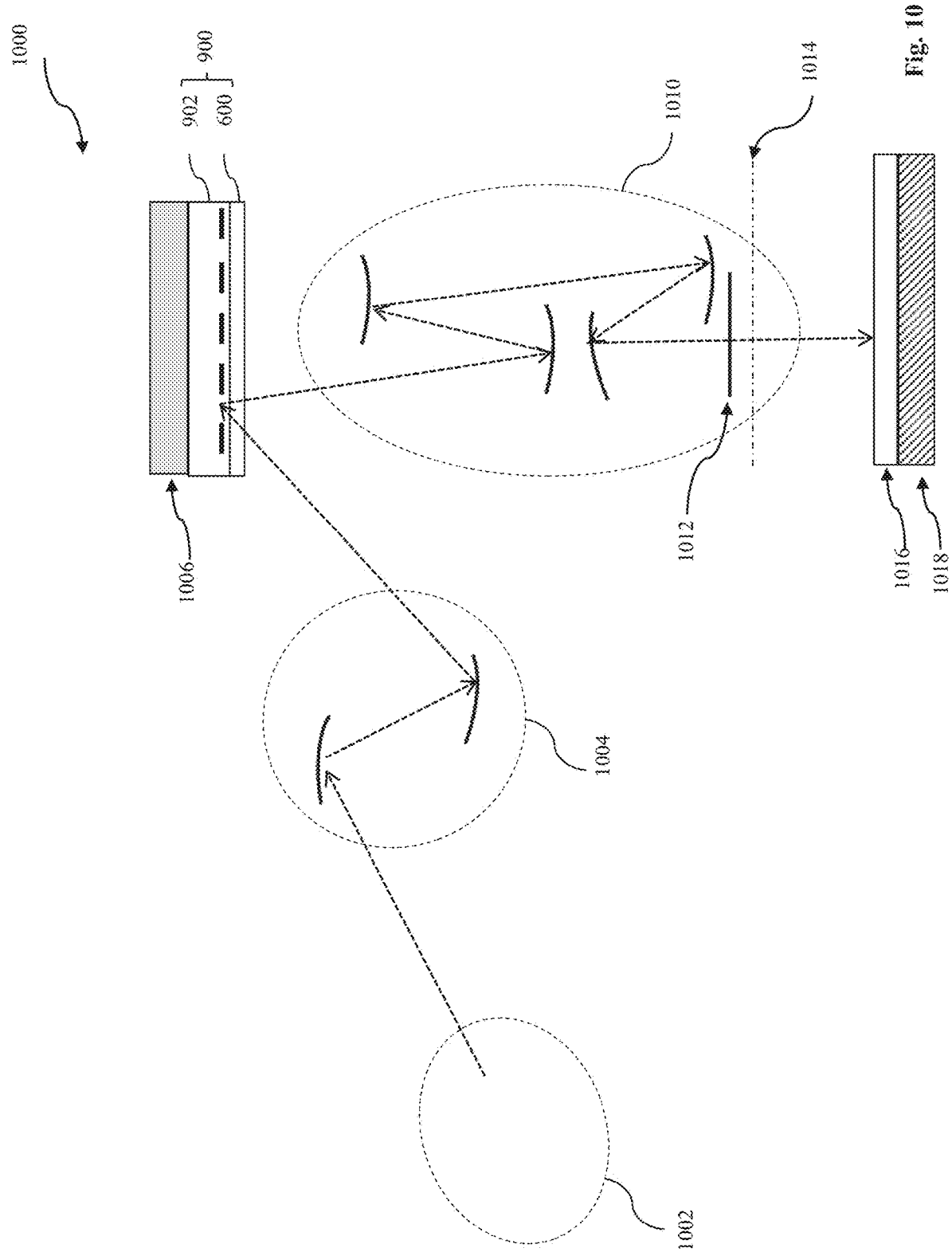

METHOD TO FABRICATE MASK-PELLICLE SYSTEM

PRIORITY DATA

The present application is a continuation application of U.S. patent application Ser. No. 14/859,136, filed Sep. 18, 2015, entitled "METHOD TO FABRICATE MASK-PELLICLE SYSTEM," issuing Dec. 5, 2017 as U.S. Pat. No. 9,835,940, the disclosure of which is hereby incorporated by reference in its entirety.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photomask (or mask) is used. The mask includes a substrate and a patterned layer that defines an integrated circuit to be transferred to a semiconductor substrate during the photolithography process. The mask is typically included with a pellicle assembly, collectively referred to as a mask-pellicle system. The pellicle assembly includes a transparent thin membrane and a pellicle frame, where the membrane is mounted over the pellicle frame. The pellicle assembly protects the mask from fallen particles and keeps the particles out of focus so that they do not produce a patterned image, which may cause defects when the mask is being used. Pellicle assemblies for EUV lithography have proved challenging to fabricate and implement, due at least in part to the difficulty of providing a thin pellicle membrane with sufficient structural integrity to span the surface of the mask. The fabrication of large, thin pellicle membranes according to certain conventional fabrication processes has been shown to cause the pellicle membrane to become distorted, wrinkled, broken, or otherwise damaged, thereby rendering the pellicle membrane unusable.

Thus, existing techniques for fabricating mask-pellicle systems have not proved entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a cross-sectional view of a portion of a mask-pellicle system after forming a release layer on a substrate according to some embodiments.

FIGS. 5A, 5B, and 5C are a perspective view, a cross-sectional view along A-A', and a top view of a pellicle frame according to some embodiments.

FIG. 10 is a schematic view of a lithography system, in accordance with some embodiments.

DETAILED DESCRIPTION

Figure 1:
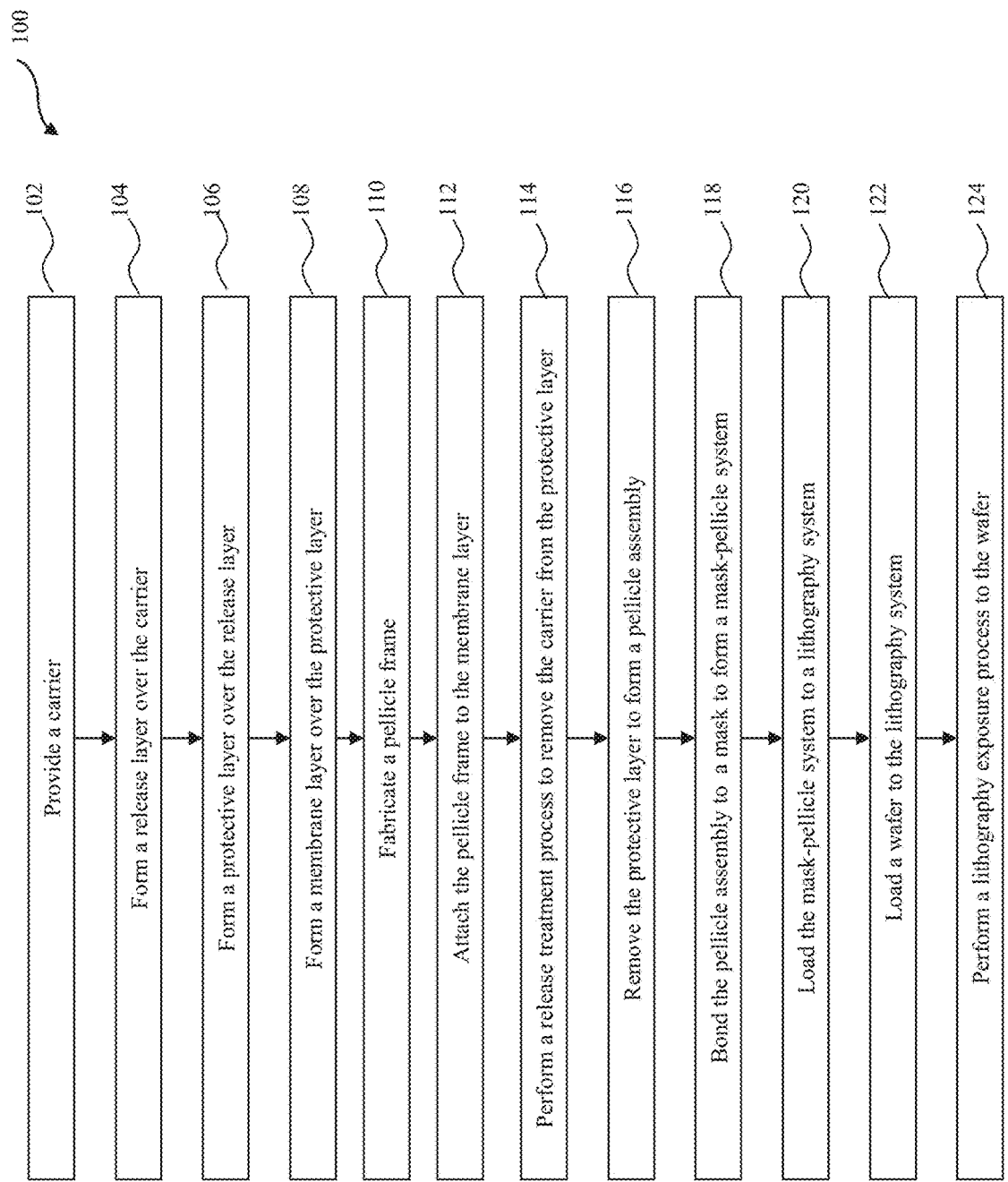
FIG. 1 is a flowchart illustrating an embodiment of a method of forming a mask-pellicle system or portion thereof according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Properties such as flatness, surface roughness, and thickness uniformity may be used herein to describe layers and their surfaces. Flatness of a surface may be measured by using a reference horizontal plane based on the lowest point of the surface, and a lowest point reference (LPR) flatness may be calculated as the distance from the highest point of the surface to the reference horizontal plane. Surface roughness of a surface may be measured by the root mean square (RMS) of roughness-component irregularities from a mean line of the surface, which is also referred to as a surface RMS roughness. Thickness uniformity of a layer may be measured by the difference between the maximum and minimum values of thickness of the layer, which is also referred to as a total thickness variation (TTV). It is noted that these measurements are exemplary only and not intended to be limiting beyond what is specifically recited in the claims that follow. For example, other ways of measuring flatness, surface roughness, and thickness uniformity would be recognized by one of ordinary skill in the art.

Referring now to FIG. 1, illustrated therein is a flowchart of one embodiment of a method 100 used to fabricate an EUV pellicle assembly, according to one or more aspects of the present disclosure. It is noted that the process steps of the method 100, including any descriptions given with reference to FIGS. 1-10, are merely exemplary and are not intended to be limiting beyond what is specifically recited in the claims that follow. The method 100 begins at block 102 where a carrier is provided. With reference to the example of FIG. 2A, in accordance with an embodiment of block 102, a carrier 202 is provided. FIG. 2A illustrates a mask-pellicle system 200 including a carrier 202 and a release layer 204 disposed over the carrier 202. In some embodiments, the carrier 202 maintains an overall rigidity and an overall thickness of the mask-pellicle system 200. The carrier 202 may support the overlying layers during subsequent fabrication steps, allow handling of the overlying layers by handling the carrier 202, and/or reduce the risk of distorting, cracking, or otherwise damaging the overlying layers that may be caused by stresses caused by transportation and/or subsequent fabrication steps.

In some embodiments, the carrier 202 may include glass, metal, ceramic, silicon, silicon oxide, aluminum oxide, other suitable materials, and/or a combination thereof. In some embodiments, the carrier 202 may include a composite structure. For example, the carrier 202 may include any number of carrier layers bonded by adhesives. In some embodiments, the carrier 202 has a thickness in a range of from about 500 μm to about 1000 μm.

Referring now to FIG. 1 and the example of FIG. 2A, in an embodiment, the method 100 then proceeds to block 104, where a release layer 204 is formed over the carrier 202. Referring to the example of FIG. 2A, the release layer 204 is disposed over a top surface of the carrier 202. In some embodiments, the release layer 204 may include a release material capable of being removed later, so that structures formed over the release layer 204 may be demounted from the carrier 202 in subsequent fabrication steps.

In some embodiments, the release layer 204 may include a polymer-based material. In some embodiments, the release layer 204 may include a thermal-release material (e.g., REVALPHA thermal release tape manufactured by Nitto Denko Corporation). In some embodiments, the release layer 204 may include a chemical-release material. In some embodiments, the release layer 204 may include a UV-release material. In some embodiments, the release layer 204 may include a laser-release material. For example, the release layer 204 may include a light-to-heat conversion (LTHC) material (e.g., 3M™ Light-To-Heat-Conversion Release Coating (LTHC) ink manufactured by 3M Company). When the release layer 204 is subjected to a release treatment process (e.g., chemical solvent dissociation, heat, laser irradiation, ultraviolet (UV) radiation), the release layer 204 will lose its attachment with, therefore be easily separated from, the structure attached to the release layer 204.

Figure 2B:
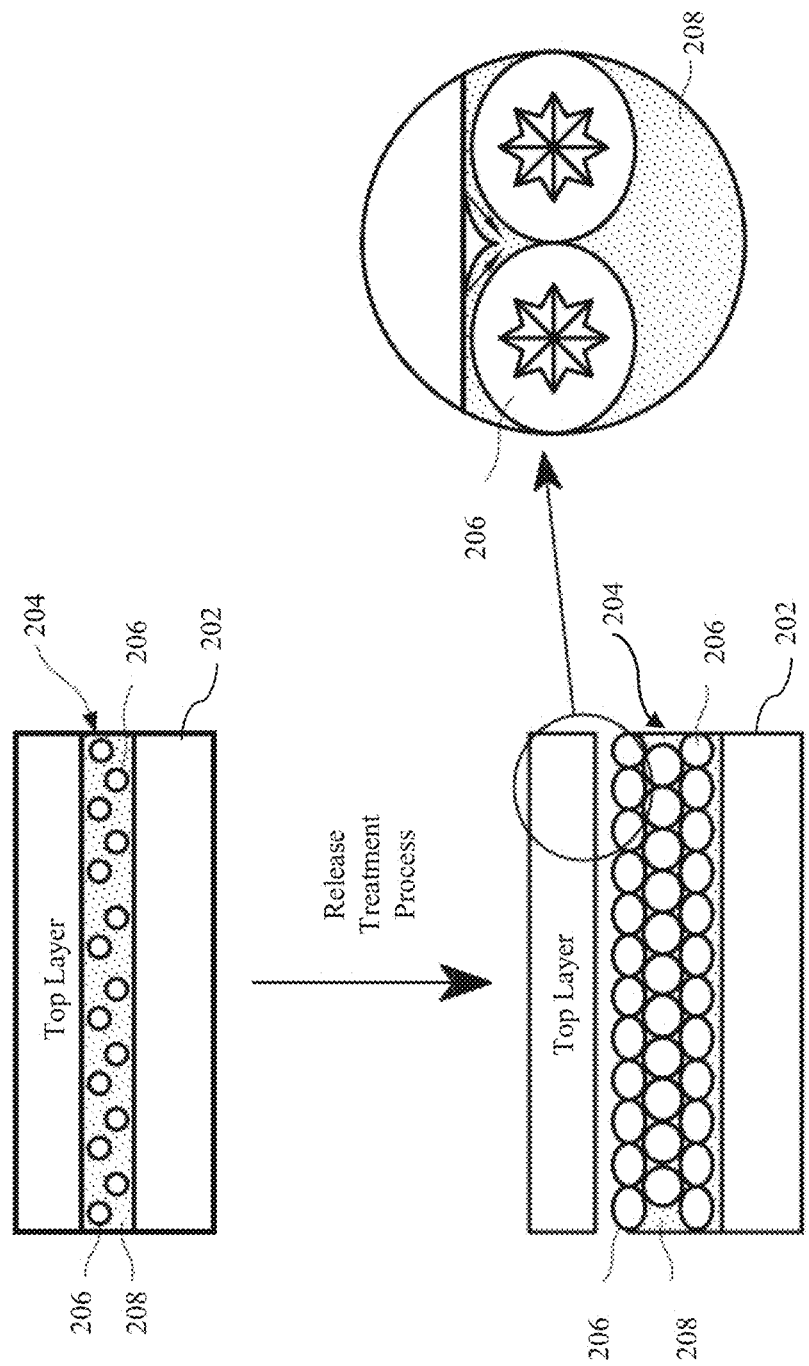
FIG. 2B is a cross-sectional view of a portion of a mask-pellicle system illustrating a treatment process of the release layer.
Figure 3:
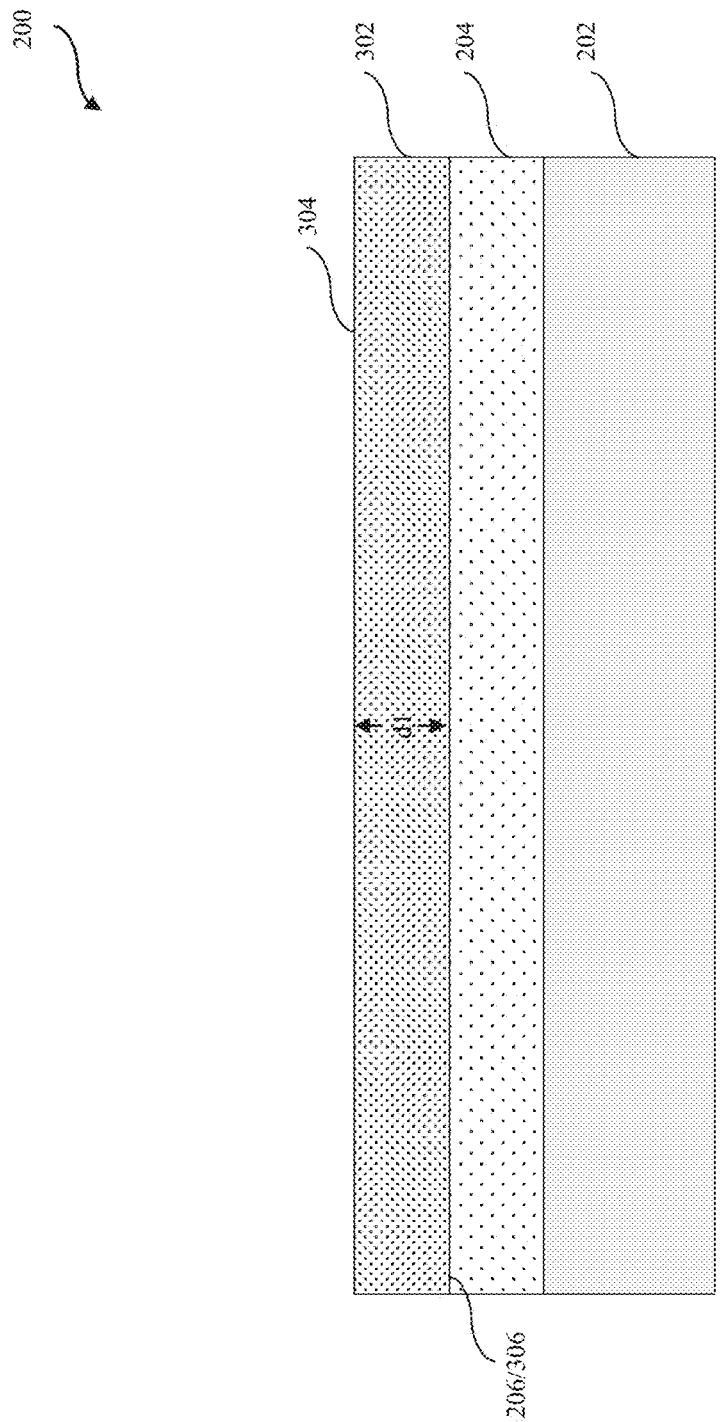
FIG. 3 is a cross-sectional view of a portion of a portion of a mask-pellicle system after forming a protective layer on the release layer according to some embodiments.

Referring to the example of FIG. 2B, in some embodiments, the release layer 204 includes a material (e.g., REVALPHA thermal release tape manufactured by Nitto Denko Corporation) that has foaming properties when treated by a release treatment process (e.g., heat, laser irradiation, ultraviolet (UV) radiation). In some embodiments, the release layer 204 includes foaming particles 206 (or material that has forming properties when treated). In some embodiments, the release layer 204 may also include an adhesive material 208. The adhesive material 208 (e.g., glue-like material) may allow the release layer 204 to be adhered or bonded to a top layer that is disposed over the release layer 204. However, when the release layer 204 is subjected to a release treatment process (e.g., heat, laser irradiation, ultraviolet (UV) radiation), the foaming particles 206 expand in size or volume. The expansion of the foaming particles 206 reduces the contact area between the release layer 204 and the top layer, thereby causing the top layer to lose its bonding or adhesion with the release layer 204. In this manner, the top layer can be easily separated from the release layer 204.

In some embodiments, the release layer 204 may be applied on the carrier 202 using spin coating, chemical vapor deposition (CVD), the like, or a combination thereof. In some embodiments, the release layer 204 is dispensed as a liquid, and is then cured. In some embodiments, the release layer 204 may have a thickness in a range of from about 10 μm to about 100 μm.

In some embodiments, a polishing/planarization process may be performed on the release layer 204. The polishing/planarization process may include a chemical mechanical polishing (CMP) process.

Referring now to FIG. 1, in an embodiment, the method 100 then proceeds to block 106, where a protective layer is formed over the release layer 204. Referring to the example of FIG. 3, a protective layer 302 with a top surface 304 and a bottom surface 306 is formed over the release layer 204. In some embodiments, the bottom surface 306 of the protective layer 302 physically contacts a top surface of the release layer 204.

In some embodiments, the protective layer 302 includes an adhesive material (e.g., glue-like material) capable of being removed by a solvent. In some embodiments, the protective layer 302 includes an organic material, which may be soluble in organic solvents. In some embodiments, the protective layer 302 may include a thermoplastic polymer. For example, the protective layer 302 may include polyethylene (PE), polyvinylchloride, polypropylene (PP), polystyrene, polyethylene terephthalate (PET), polyoxyethylene glycol (PEG), polyoxypropylene glycol (PPG), Adipic ester (ADP), other thermoplastic materials, and/or any combination thereof.

In some embodiments, the protective layer 302 has a thickness d1. The thickness d1 is determined according to design specifications, wherein thickness of the protective layer 302 provides for control of the protective layer removal process 800 which will discussed in detail with reference to FIG. 8A. In one example, the protective layer 302 has a thickness in a range of from about 1 µm to about 100 µm.

In some embodiments, the protective layer 302 includes a dielectric material, for example, silicon dioxide ($SiO_2$), silicon oxynitride, etc. The protective layer 302 may be applied on the release layer 204 using spin coating, chemical vapor deposition (CVD), plasma-enhanced chemical vapor deposition (PECVD) process, the like, or a combination thereof. In some embodiments, the protective layer 302 is dispensed as a liquid, and is then cured. In some embodiments, the protective layer 302 may include multiple layers.

In some embodiments, a polishing/planarization process may be performed on the protective layer 302. The polishing/planarization process may include CMP.

Figure 4A:
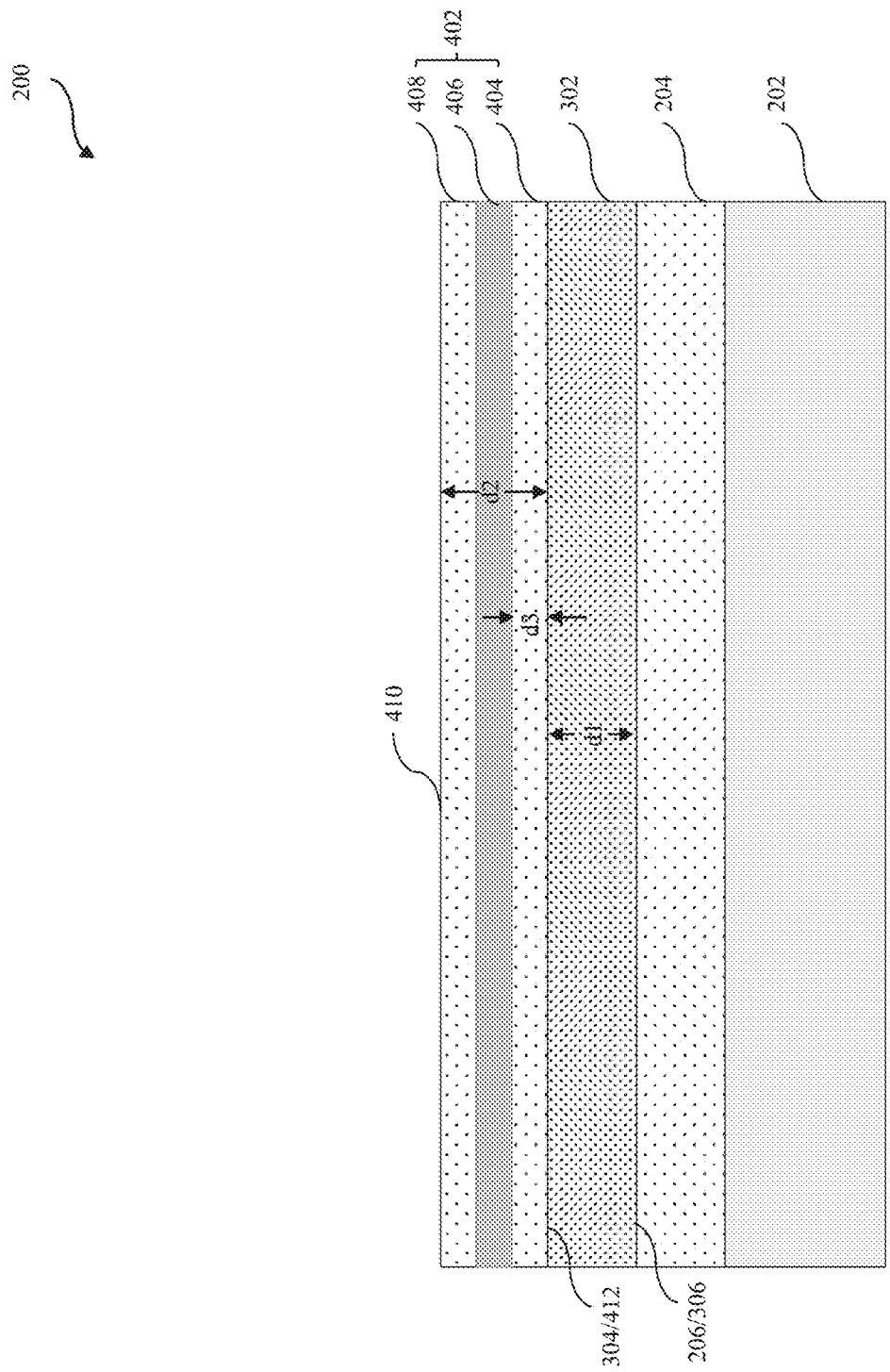
FIGS. 4A and 4B are cross-sectional views of a portion of a portion of a mask-pellicle system after forming a membrane layer on the release layer according to various embodiments.
Figure 4B:
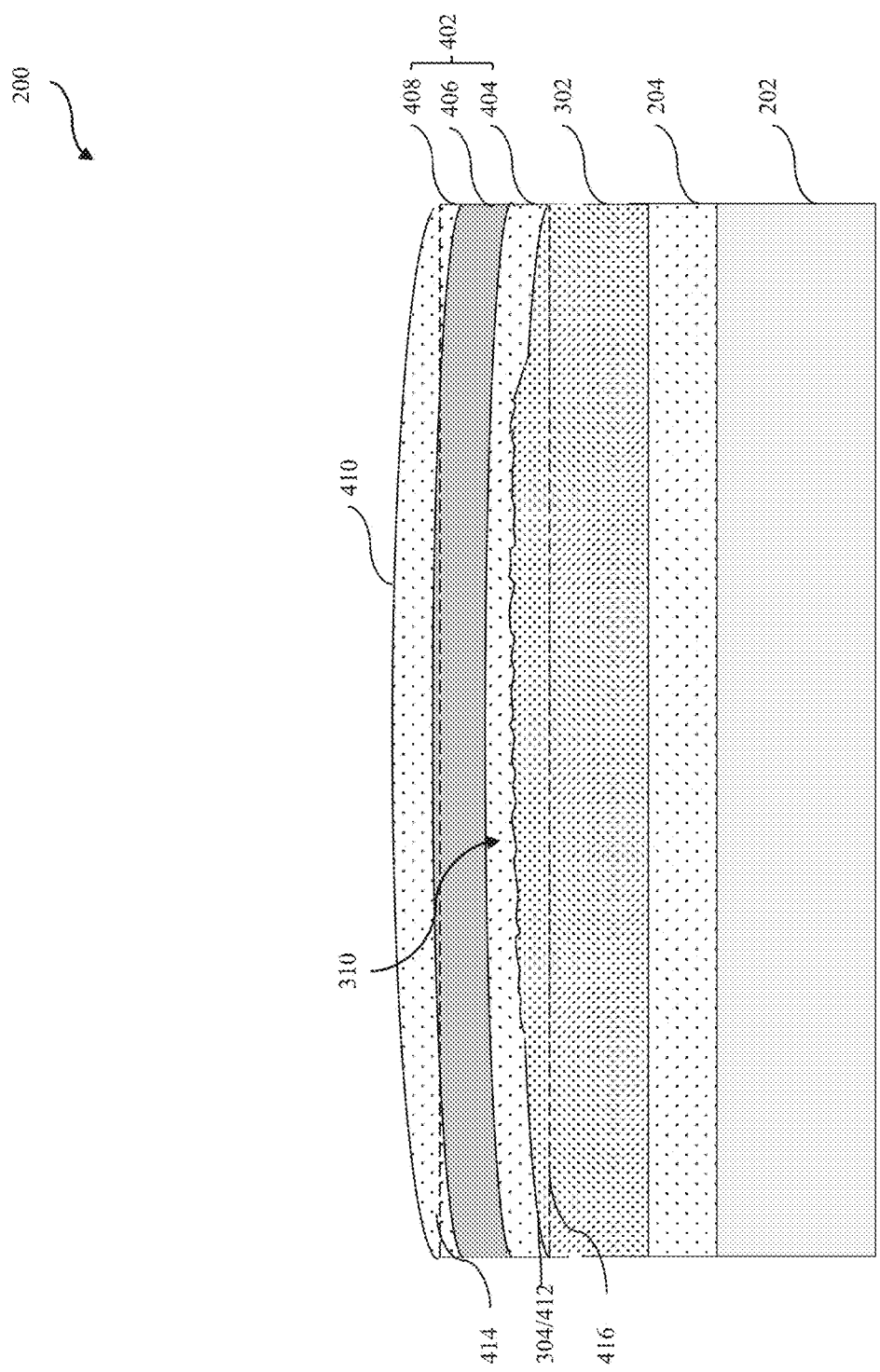
Figure 5A:
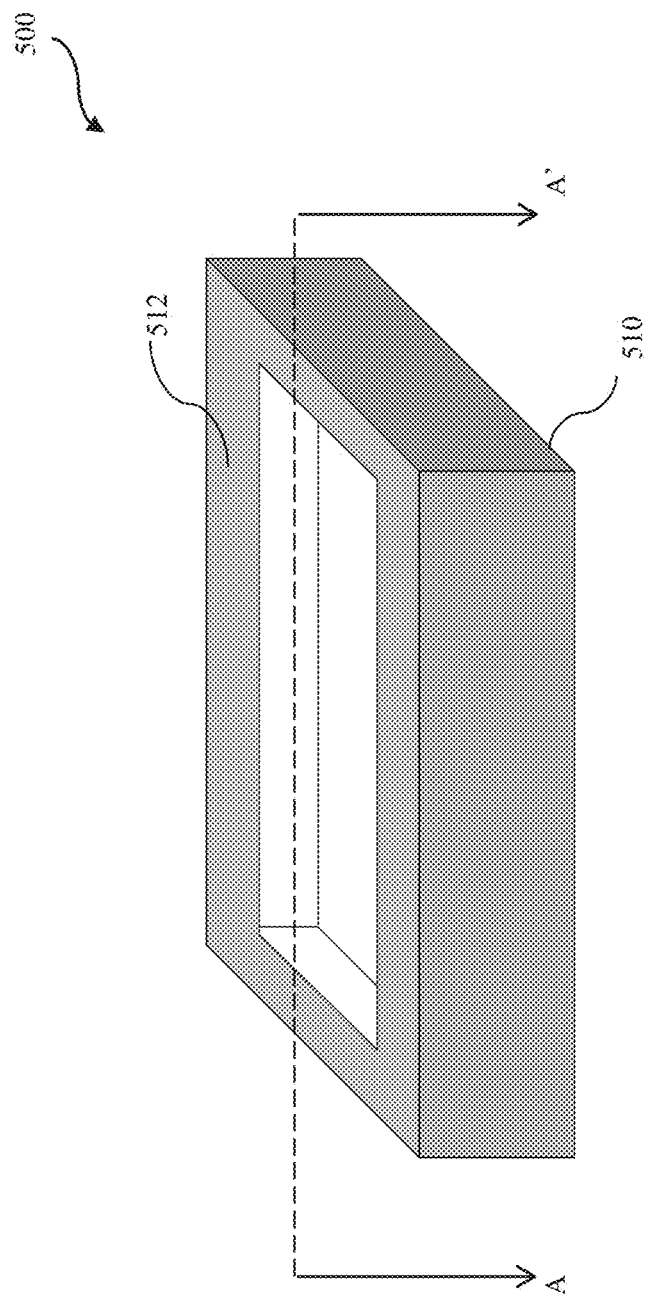

Referring now to FIG. 1 and the examples of FIGS. 4A-4B, in an embodiment, the method 100 then proceeds to block 108, where a membrane layer 402 is formed on the protective layer 302. The membrane layer 402 may be a conformal layer formed on the protective layer 302. In some embodiments, the membrane layer 402 has a surface 412 physically contacting a top surface 304 of the protective layer 202 and a surface 410. The attachment of the membrane layer 402 to the protective layer 302 (and as such to the release layer 204 and the carrier 202) may prevent or minimize damage to the membrane layer 402. In more detail, transportation and various subsequent processes produce stress to and involve movement (e.g., vertical movement) of the membrane layer 402. Such stress may cause the membrane layer 402 to tear, peel, scratch, or break, particularly since the membrane layer 402 is thin. Because the membrane layer 402 is bonded to the carrier 202 through the release layer 204 and the protective layer 302, the movement of the membrane layer 402 is tied to the carrier 202. With the support of the carrier 202, the release layer 204, and the protective layer 302, the membrane layer 402 is less likely to tear, peel, scratch, or break during subsequent fabrication process steps.

The membrane layer 402 may include one or more materials including silicon, polymer, silicon nitride (SiN), polycrystalline silicon (poly-Si), silicon carbide (SiC), ruthenium (Ru), a SiN/poly-Si/SiN sandwich film stack, a Si-based compound, other suitable materials, and/or a combination thereof. In some embodiments, the membrane layer 402 includes a material with a sufficient mechanical strength to serve as a pellicle membrane stretched across a pellicle frame in a mask-pellicle system in subsequent fabrication steps.

In the example of FIG. 4A, the membrane layer 402 may have various properties (e.g., thickness, thickness uniformity, surface roughness, and/or flatness) determined according to design specifications. The membrane layer design specifications may be provided to ensure that the pellicle membrane 402 does not adversely affect the image patterned on a wafer in an EUV lithography process. In some embodiments, the membrane layer 402 has a thickness d2 determined according to design specifications. In some examples, the thickness d2 is less than 100 nm. In some examples, the thickness d2 is less than 50 nm. In some embodiments, the membrane layer 402 may include any number of layers. In the example of FIG. 4A, the membrane layer 402 includes a first sublayer 404 (also referred to as a bottom sublayer), a second sublayer 406 (also referred to as a middle sublayer) disposed over the first sublayer 404, and a third sublayer 408 (also referred to as a top sublayer) disposed over the second sublayer 406. The first, second, and third sublayers 404, 406, and 408 may have the same thickness or different thicknesses from each other. For example, the first sublayer 404 may have a thickness d3 that is different from the thickness of the second sublayer 406 or the third sublayer 408. The first, second, and third sublayers 404, 406, and 408 may include the same material or have materials different from each other. In one example, the first sublayer 404 includes SiN and has a thickness d3 that is less than about 10 nm (e.g., 5 nm). In some examples, the second sublayer 406 includes poly-Si and has a thickness that is less than about 100 nm (e.g., 40 nm). In some examples, the third sublayer 408 includes SiN and has a thickness that is less than about 10 nm (e.g., 5 nm). In some embodiments, the first sublayer 404 and the third sublayer 408 may provide support to the second sublayer 406 and reduce oxidation on both the top and bottom surfaces of the second sublayer 406.

In some embodiments, the membrane layer 402 may have a TTV thickness uniformity that is less than about 10 nm (e.g., 5 nm). In some embodiments, each of the surfaces 410 and 412 may have a surface RMS roughness that is less than about 10 nm (e.g., 5 nm). In some embodiments, each of the surfaces 412 and 412 may have a LPR flatness that is less than about 10 nm (e.g., 5 nm).

In some embodiments, the membrane layer 402 may be formed by one or more deposition processes including CVD, spin-on coating, PECVD, and/or other suitable deposition processes or oxidation processes, or a combination thereof. In some embodiments, the membrane layer 402 may be formed without an etching process or a lithography process and various processes associated with the lithography process (e.g., an exposure process, a development process, an etch process).

In some embodiments, a polishing and/or planarization process may be performed on the membrane layer 402 such that the membrane layer 402 reaches the required thickness, thickness uniformity, and/or surface roughness. The polishing and/or planarization process may include CMP.

Referring now to the example of FIG. 4B, in some embodiments, the flatness, thickness uniformity, and/or surface roughness of the protective layer 302 may affect the flatness and surface roughness of the overlying layers, including the membrane layer 402 and each of its sublayers. As shown in the example of FIG. 4B, the top surface 304 of the protective layer 302 physically contacts the surface 412 of the membrane layer 402. In some embodiments, surface roughness of the top surface 304 (e.g., caused by the surface irregularities 310) may affect the surface roughness of the surface 412 of the membrane layer 402. Further, as shown in the example of FIG. 4B, in some embodiments, the flatness of the top surface 304 may affect the flatness of the surfaces 412 and 410 of the membrane layer 402. As shown in FIG. 4B, the LPR flatness of the surface 410 may be measured by using a horizontal reference plane 414 passing the lowest point of the surface 410, and the LPR flatness of the surface 412 and/or top surface 304 may be measured by using a horizontal reference plane 416 passing the lowest point of the surface 412 and/or top surface 304.

Thus, in various embodiments, prior to depositing the membrane layer 402 to the protective layer 302, the top surface 304 may have a surface roughness and a flatness determined and controlled according to design specifications. The protective layer design specifications may provide for control of the flatness and surface roughness of the overlying layers, including the membrane layer 402 and each of its sublayers. In some examples, the top surface 304 has a surface RMS roughness that is less than about 50 nm.

In some examples, the top surface 304 has an LPR flatness that is less than 50 nm. In some embodiments, the protective layer 302 is formed using a spin coating process. In one example, spin parameters and/or solution concentration of the spin coating process are controlled such that the top surface 304 has a predetermined surface roughness (e.g., less than 1 nm). In some embodiments, to meet the surface roughness and flatness requirements of the protective layer 302, a polishing process (e.g., CMP) may be performed on the protective layer 302 before the membrane layer 402 is formed.

Referring now to FIG. 1 and FIGS. 5A-5C, in an embodiment, the method 100 then proceeds to block 110, where a pellicle frame 500 is fabricated. Referring to the example of FIG. 5A, a pellicle frame 500 with a top surface 512 and a bottom surface 510 is illustrated. Referring now to the example of FIG. 5B, interior surfaces 508 of sidewalls of the pellicle frame 500 may form an opening 514. The pellicle frame 500 may also include a vent hole 504 with a filter 506, which may equalize the pressure between a space inside a mask-pellicle system and the space surrounding the mask-pellicle system.

Referring to the examples of FIG. 5B and FIG. 5C, the pellicle frame 500 has a height H, and sidewalls of the pellicle frame 500 have a width W. By way of example, the greater the height H and/or sidewall width W are, the greater the amount of light may be blocked by the pellicle frame 500 during a lithography process. Pellicle frames used in various lithography systems using different radiation sources may have different height H and sidewall width W. In one embodiment, for a pellicle frame 500 to be used in an EUV lithography system, the pellicle frame 500 has a height H of about 2.0 mm, and sidewall width W that is equal to or less than about 2.0 mm. In some embodiments, for example in an ArF lithography system, the height H may be about 3.1 mm, and the sidewall width W may be about 1.5 mm.

The pellicle frame 500 may have a shape, dimensions, and a configuration so as to secure a pellicle membrane properly across the pellicle frame 500. The pellicle frame 500 may have various dimensions, shapes, and configurations. For example, the opening 514 may have various dimensions and shapes. Referring to the example of FIG. 5C, in some embodiments, the opening 514 includes an open area 516 that is rectangular and extends a first distance S1 along a first direction X, and extends a second distance S2 along a second direction Y perpendicular to the first direction X. For further example, the pellicle frame 500 may have one single component or multiple components. In some embodiments, the pellicle frame 500 may be mechanically rigid, have flat top and bottom surfaces, and stable. In some embodiments, the pellicle frame 500 may include aluminum (Al), aluminum oxide, Al-alloy, titanium (Ti), nickel (Ni), gold (Au), silver (Ag), copper (Cu), molybdenum (Mo), platinum (Pt), chromium (Cr), manganese (Mn), iron (Fe), cobalt (Co), palladium (Pd), tantalum (Ta), tungsten (W), silicon, polymer, other suitable materials, and/or combinations thereof. In some embodiments, the pellicle frame 500 may include a fame material with a coefficient of thermal expansion (CTE) determined according to design specifications.

In some embodiments, during the pellicle frame fabrication process, neither of the top surface 512 nor the bottom surface 510 of the pellicle frame 500 is attached to a pellicle membrane. The pellicle frame 500 may be fabricated without the handling of a pellicle membrane attached to the pellicle frame 500, which may increase reliability and overall yield of the pellicle frame fabrication process.

Figure 6:
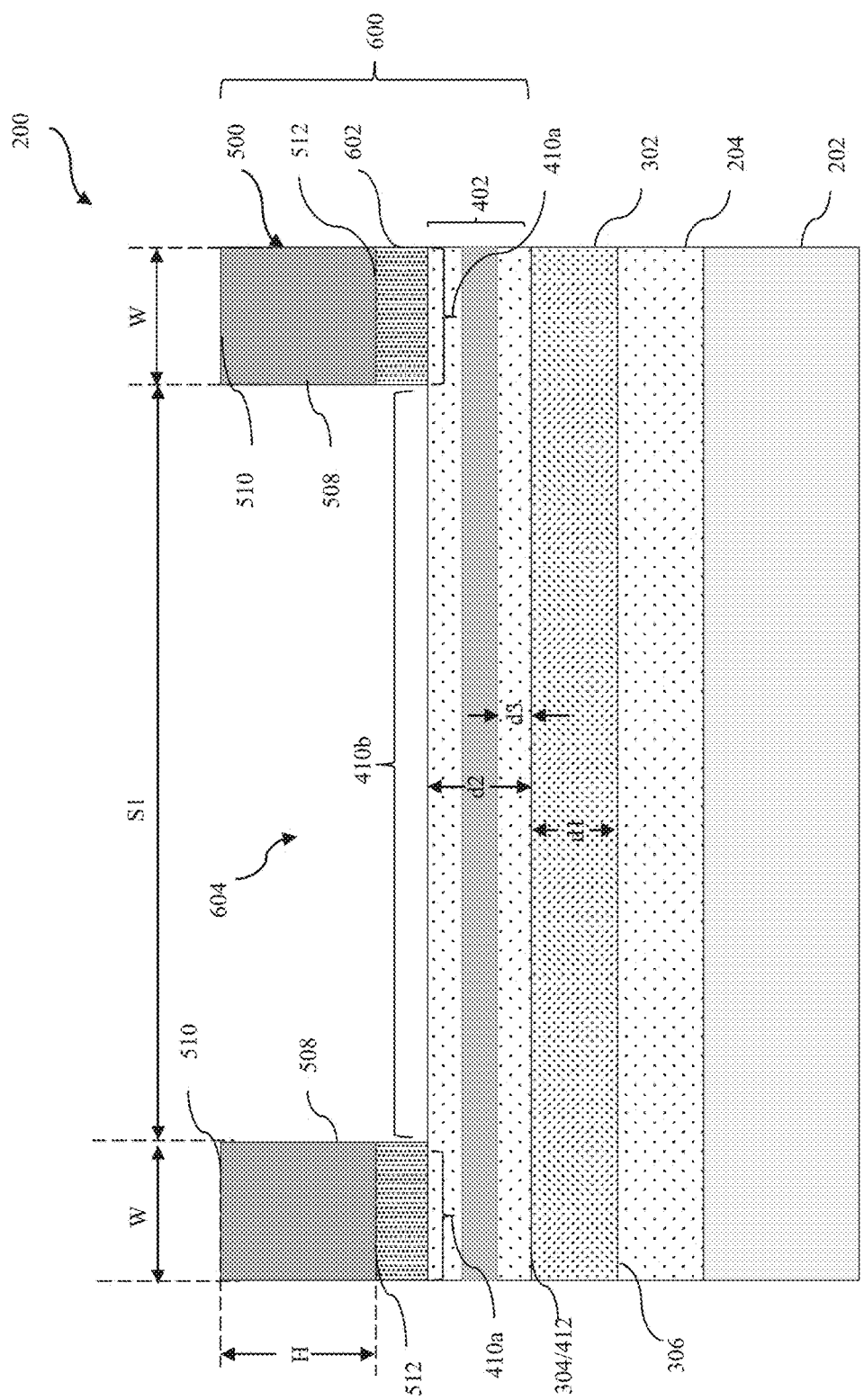
FIG. 6 is a cross-sectional view of a portion of a mask-pellicle system after attaching the pellicle fame to the membrane layer according to some embodiments.

Referring now to FIG. 1 and the example of FIG. 6, in an embodiment, the method 100 then proceeds to block 112, where a pellicle frame 500 is attached to the membrane layer 402 (and as such to the protective layer 302, the release layer 204, and the carrier 202) after a frame attaching process is performed. During the fame attaching process, the underlying layers of the membrane layer 402 may provide support and mechanical strength to the membrane layer 402, and reduce or minimize damage to the membrane layer 402. After the membrane layer 402 is attached to the pellicle frame 500, the pellicle frame 500 may provide support to the membrane layer 402 and help maintains an overall rigidity and thickness of the mask-pellicle system 200.

Referring to the example of FIG. 6, the pellicle frame 500 is flipped upside down, and a top surface 512 of the pellicle frame 500 is placed directly over a first portion 410a of a surface 410 of the membrane layer 402. In some embodiments, a frame adhesive 602 is used to bond the pellicle frame 500 to the membrane layer 402, and a bottom surface of the frame adhesive 602 physically contacts the first portion 410a of the surface 410. The pellicle frame 500, the membrane layer 402, and the frame adhesive 602 form a pellicle assembly structure 600 disposed on the protective layer 302.

After the frame attaching process is performed, in some embodiments, a second portion 410b of the surface 410, interior surfaces 508 of sidewalls of the pellicle frame 500, and interior surfaces of sidewalls of the frame adhesive 602 form an opening 604. In one example, the shape and size of the second portion 410b of the surface 410 is defined by the interior surfaces 508 of sidewalls of the pellicle frame 500. In some embodiments, the second portion 410b of the surface 410 has the same shape and size as the open area 516. In one example, the second portion 410b of the surface 410 has a size of S1 in the first direction X, and a size S2 in the second direction Y. The second portion 410b of the surface 410 remains exposed by the opening 604.

In some embodiments, the frame adhesive 602 includes a thermoset material, for example, epoxy, Benzocyclobutene (BCB), Methylsilsesquioxane (MSQ), polyimides, other thermoset materials, and/or a combination thereof. In some embodiments, the frame adhesive 602 includes a material that is not soluble in a solvent for removing the protective layer 302 in subsequent fabrication steps.

Figure 7:
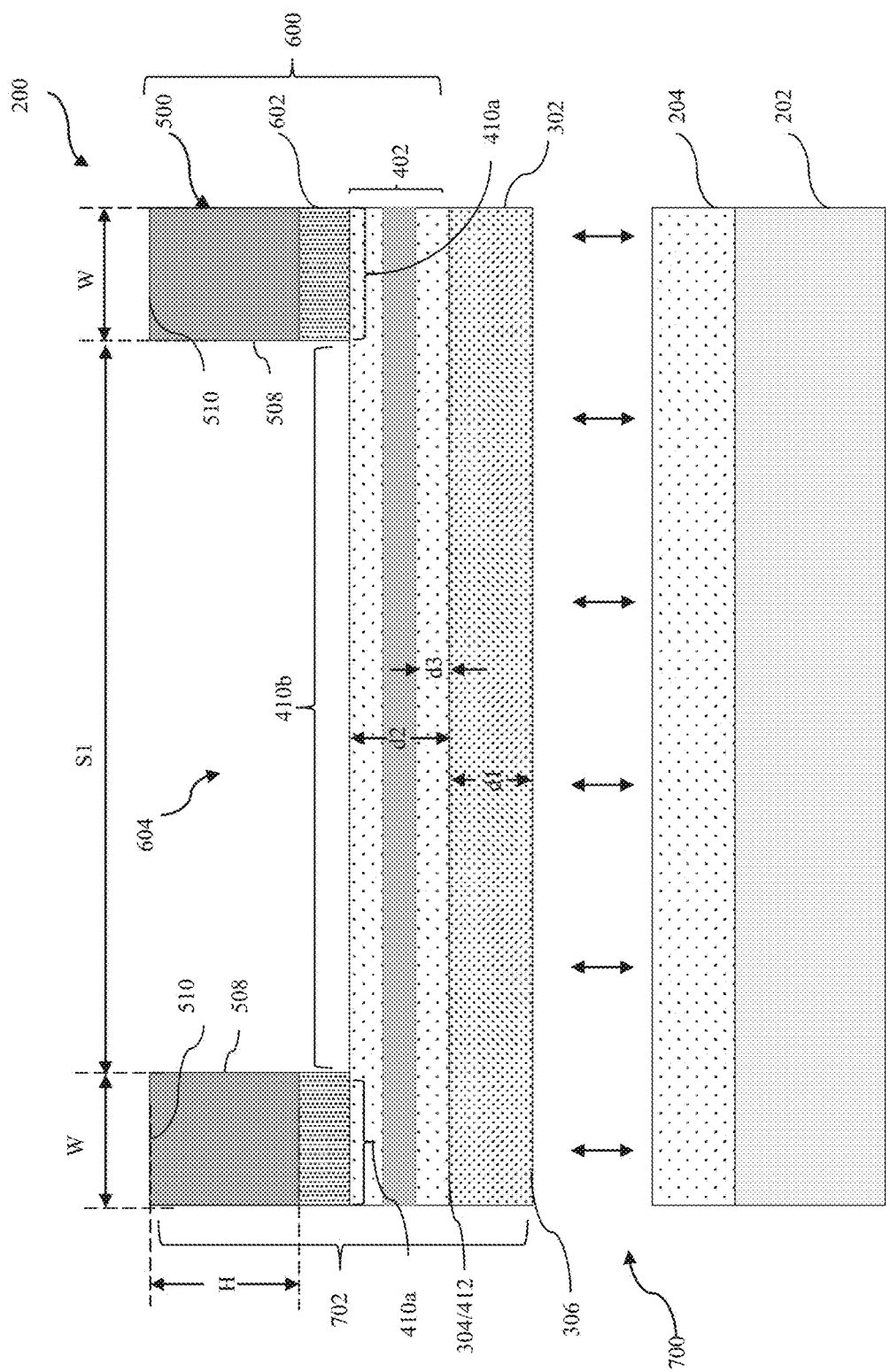
FIG. 7 is a cross-sectional view of a portion of a mask-pellicle system after removing a substrate and a release layer according to some embodiments.

Referring now to FIG. 1 and the example of FIG. 7, in an embodiment, the method 100 then proceeds to block 114, where a release treatment process 700 is performed to separate the carrier 202 and the release layer 204 from the mask-pellicle system 200, thereby forming a pellicle assembly holder 702. The pellicle assembly holder 702 includes the protective layer 302 and the pellicle assembly structure 600 disposed over the protective layer 302. As illustrated in the example of FIG. 7, after performing the release treatment process 700, the bottom surface 306 of the protective layer 302 becomes exposed.

In some embodiments, the release treatment process 700 includes removing the release layer 204 using a chemical solvent. Alternatively, in some embodiments, the release treatment process 700 includes chemical free steps to cause the release layer 204 to lose adhesion without including any wet chemistry or soaking steps. In one example, a laser may be applied to the release layer 204 under room temperature to allow easy, low force, chemical free separation of the release layer 204 and the protective layer 302. In some embodiments, as discussed above with reference to FIGS. 2A-2B, under application of heat, UV radiation, laser treatment, and/or other applicable treatment, the foaming materials 206 in the release layer 204 may expand, thereby causing the release layer 204 to lose its attachment with the pellicle assembly holder 702. In this manner, the release layer 204 and the carrier 202 are separated from the protective layer 302, resulting in a pellicle assembly holder 702.

In some embodiments, after the release treatment process 700, the remaining release layer 204 may be removed from the carrier 202 (e.g. using a stripping process, grinding, polishing, and/or etching). The carrier 202 may be recycled and reused, e.g., for fabricating another pellicle assembly, or for any other suitable processes.

Figure 8A:
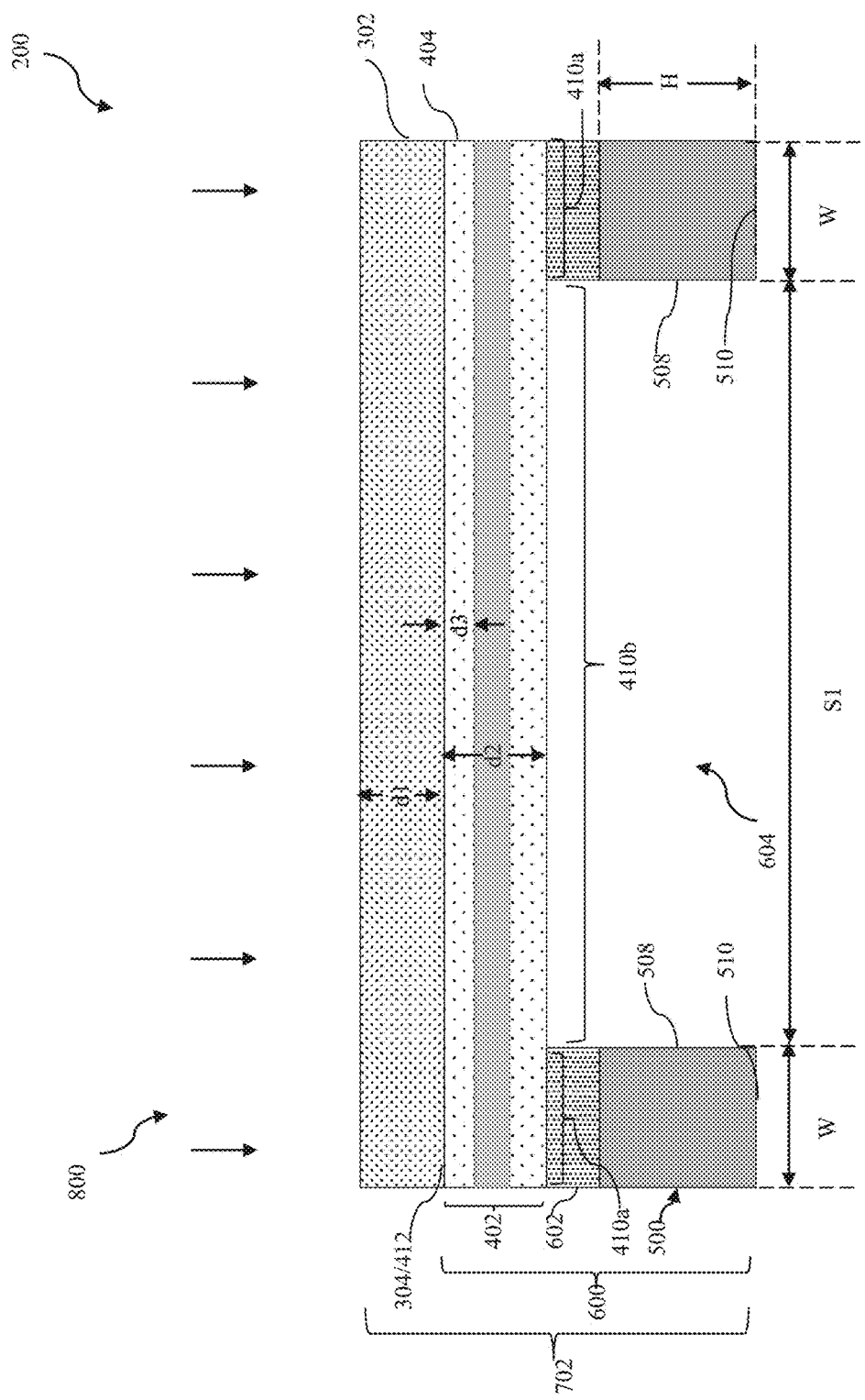
FIG. 8A is a cross-sectional view of a portion of a mask-pellicle system when a protective layer is being removed according to some embodiments.
Figure 8B:
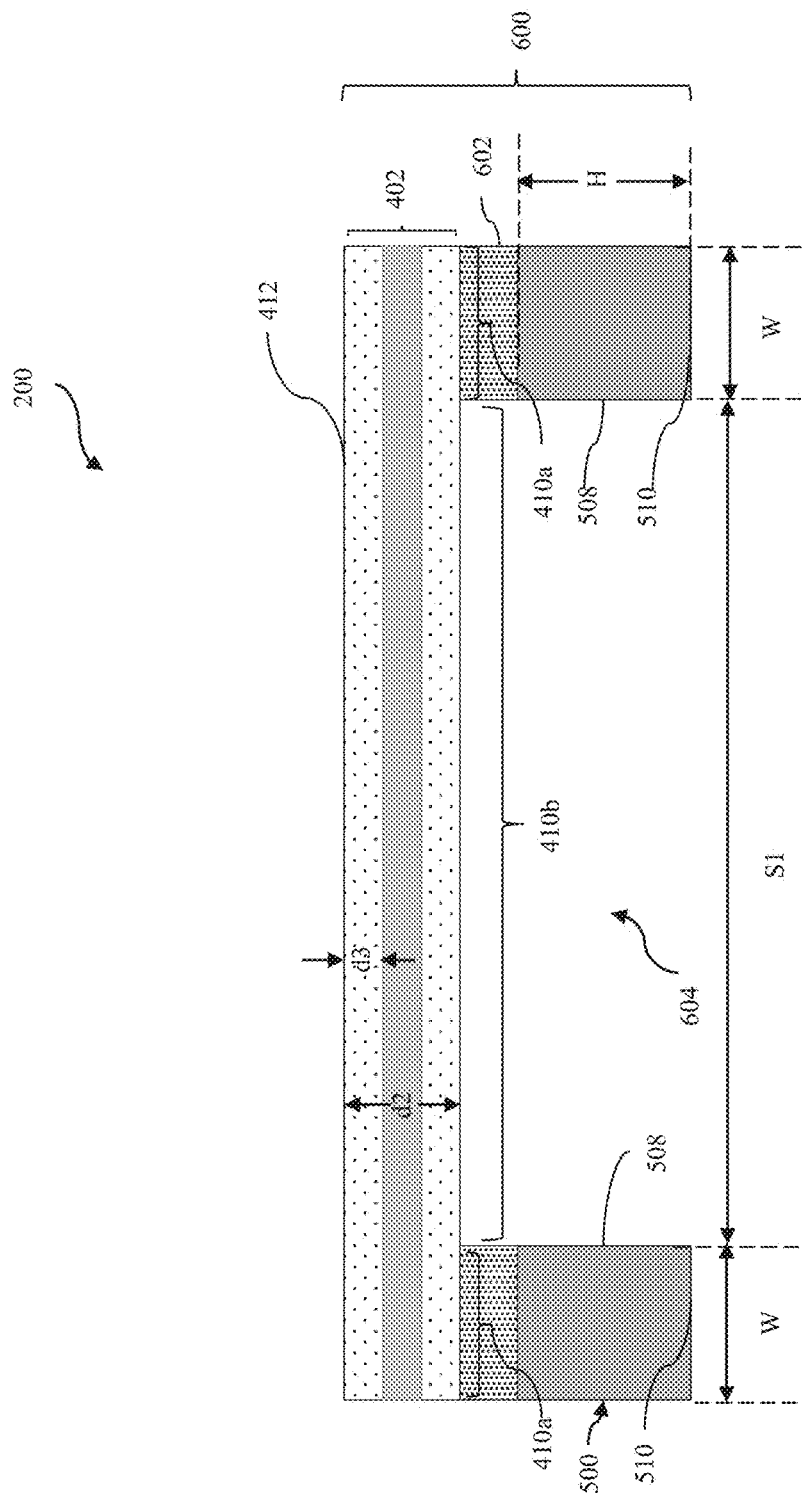
FIG. 8B is a cross-sectional view of a portion of a mask-pellicle system after removing a protective layer according to some embodiments.

Referring now to FIG. 1 and FIGS. 8A-8B, in an embodiment, the method 100 then proceeds to block 116 where the protective layer 302 is removed from the pellicle assembly holder 702. Referring now to the example of FIG. 8A, illustrated is a protective layer removal process 800 applied to the pellicle assembly holder 702 flipped vertically (i.e., upside down) to remove the protective layer 302.

In some embodiments, the protective layer removal process 800 uses a solution including an organic solvent to remove the protective layer 302. In some examples, the protective layer 302 may be immersed in the solution for a predetermined amount of time, during which the protective layer 302 is dissolved and removed. In some examples, the frame adhesive 602 may include a material (e.g., a thermosetting polymer) that is not soluble in the solution, and remains substantially the same during the protective layer removal process 800.

In some embodiments, the protective layer removal process 800 includes one or more etching processes. In some embodiments, a sublayer (e.g., the first sublayer 404) of the membrane layer 402 that physically contacts the protective layer 302 has a sufficient etch selectivity with respect to the protective layer 302, and serves as an etch stop layer in the etching processes. In some embodiments, the pellicle assembly structure 600 may remain substantially the same during the protective layer removal process 800. For example, the thickness d2 of the membrane layer 402 and thickness of each of its sublayers remain substantially the same. For further example, the shape and size of the second portion 410b of the surface 410 remains substantially the same. For further example, the height H and sidewall width W of the pellicle frame 500 remain substantially the same. For further example, the frame adhesive 602 may include a material that is not soluble in etchants used in the etching processes, and remains substantially the same.

In some embodiments, the protective layer removal process 800 includes a dry-etching process. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

In some embodiments, the protective layer removal process 800 includes a wet-etching process using a wet etchant. In some examples, the wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

In some embodiments, the protective layer removal process 800 includes a combination of a dry-etching process and wet-etching process. In some embodiments, the protective layer removal process 800 does not include any dry-etching process. In some embodiments, the protective layer removal process 800 may include CMP or a cleaning process.

Referring now to the example of FIG. 8B, illustrated therein is a pellicle assembly structure 600 after the protective layer removal process 800 is performed. The pellicle assembly structure 600 (also referred to as the pellicle assembly 600) includes the pellicle membrane 402, the pellicle frame 500, and the frame adhesive 602. At this fabrication stage, the membrane layer 402 (also referred to as the pellicle membrane 402) serves as the pellicle membrane for the pellicle assembly structure 600. The surface 412 of the membrane layer 402 now is exposed and serves as the top surface of the pellicle membrane 402. The second portion 410b of the surface 410 of the membrane layer 402 becomes the bottom surface of the pellicle membrane 402. Thus, the surface 412 may also be referred to as the top membrane surface 412, and the second portion 410b of the surface 410 may also be referred to as the bottom membrane surface 410b.

In some embodiments, after the protective layer removal process 800 is performed, surfaces of the pellicle membrane 402 may have a surface roughness determined according to design specifications. In some examples, the top membrane surface 412 has a surface RMS roughness that is less than about 10 nm. In some examples, the bottom membrane surface 410b has a surface RMS roughness that is less than 10 nm. In some embodiments, to meet the surface roughness and flatness requirements of the pellicle membrane 402, a polishing process (e.g., CMP) may be performed on the pellicle membrane 402 during or after the protective layer removal process 800.

Figure 9A:
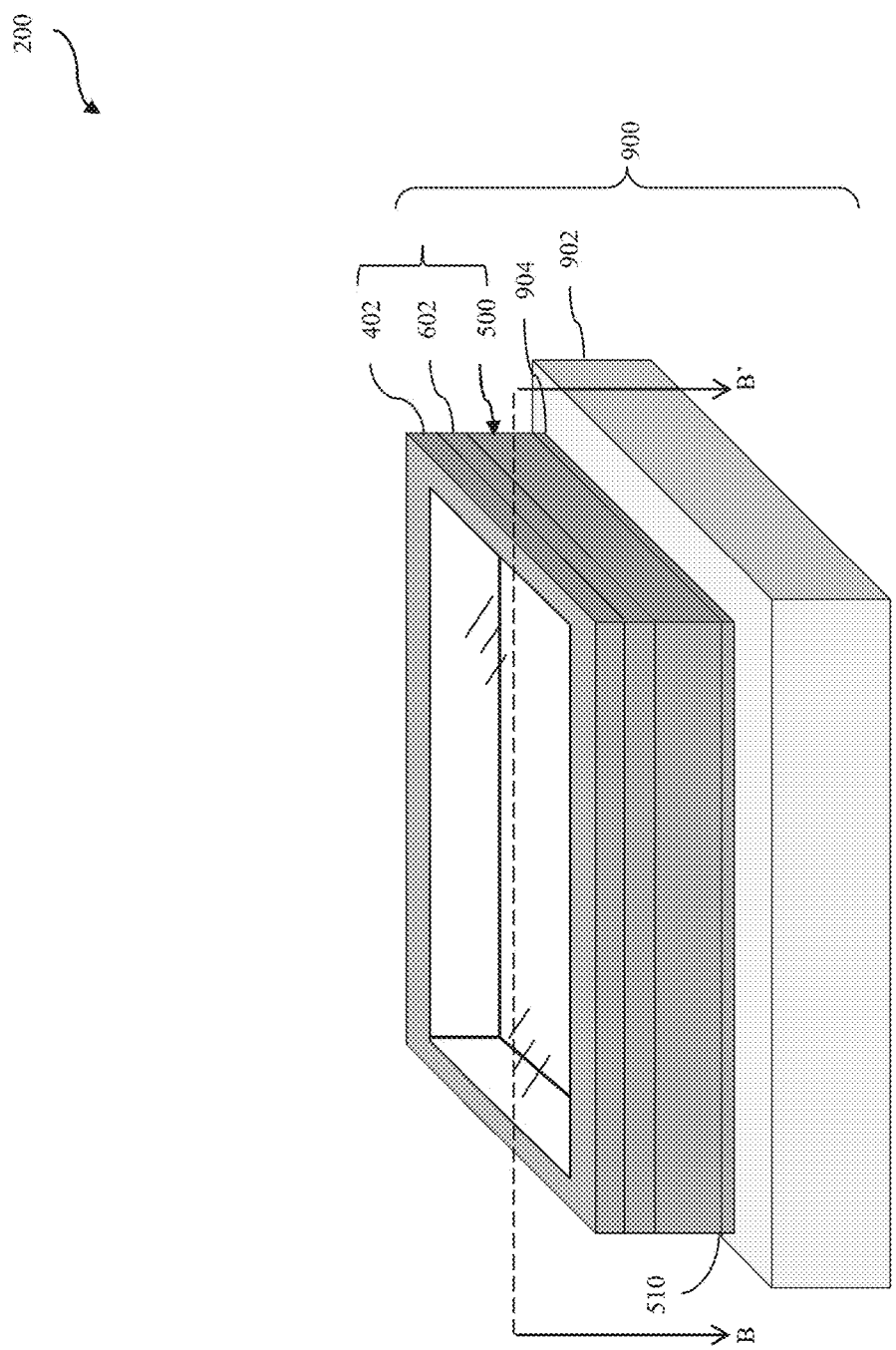
FIGS. 9A and 9B are a perspective view and a cross-sectional view along line B-B' of a mask-pellicle system according to some embodiments.

Referring now to FIG. 1 and the example of FIG. 9A, in an embodiment, the method 100 then proceeds to block 118, where the pellicle assembly 600 is placed or positioned over, and optionally bonded to an EUV mask 902 to form a mask-pellicle system 900. In some embodiments, a bottom surface 510 of the pellicle frame 500 is attached to a top surface of the EUV mask 902 using a mask adhesive 904. As shown in the example of FIG. 9A, the pellicle membrane 402 is stretched and mounted over the pellicle frame 500 to prevent particles from reaching the EUV mask 902. The pellicle membrane 402 is stretched over the pellicle frame to ensure that it is flat and does not adversely affect the image patterned on a wafer in an EUV lithography process.

In some embodiments, the mounting the pellicle assembly 600 to the EUV mask 902 may exert mechanical stresses on the EUV mask 902 and affect the flatness of the EUV mask 902. In some embodiments, stress caused by thermal expansion of the materials of different parts of the mask-pellicle system 900 may affect the flatness of the EUV mask (e.g., by offsetting the mechanical stresses the pellicle assembly 600 asserted on the EUV mask 902) and/or the flatness of the pellicle membrane 402. Therefore, in some embodiments, the pellicle frame 500 may include a frame material having a CTE determined according to design specifications, where the CTE specification provides for control of the flatness of the EUV mask and/or the flatness of the pellicle membrane 402. In one embodiment, the frame material has a CTE that closely matches the CTE of the semiconductor substrate (e.g., including quartz formed by $SiO_2$) of the EUV mask 902. In one embodiment, the difference between the CTEs of the frame material and the semiconductor substrate is less than about 5 ppm/K. In one example, the difference between the CTEs of the frame material and the semiconductor substrate is in a range of about from 2 ppm/K to 3 ppm/K.

Figure 9B:
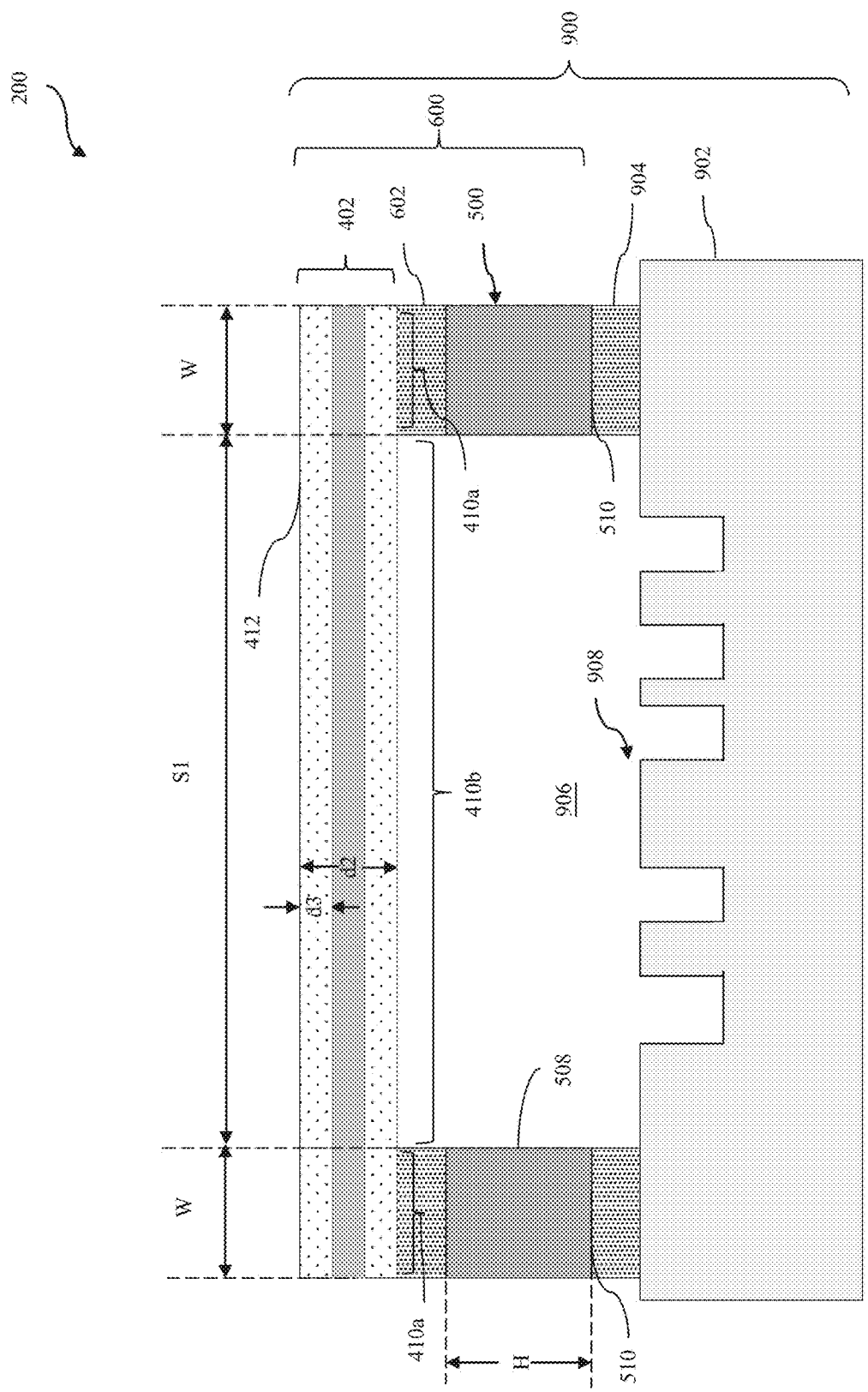

Referring now to the example of FIG. 9B, a cross-sectional view along line B-B' of FIG. 9A of a mask-pellicle system according to some embodiments is illustrated. As shown in the example of FIG. 9B, the pellicle assembly 600 is placed or positioned over, and optionally bonded to an EUV mask 902 to form a mask-pellicle system 900. The EUV mask 902 may include a patterned surface 908 used to pattern an image into a semiconductor substrate by a lithographic process. An internal space 906 may be formed by the interior surfaces 508 of the pellicle frame 500, the bottom membrane surface 410b, the interior surfaces of mask adhesive 904 and frame adhesive 602, and a top surface of the mask 902.

Figure 9C:
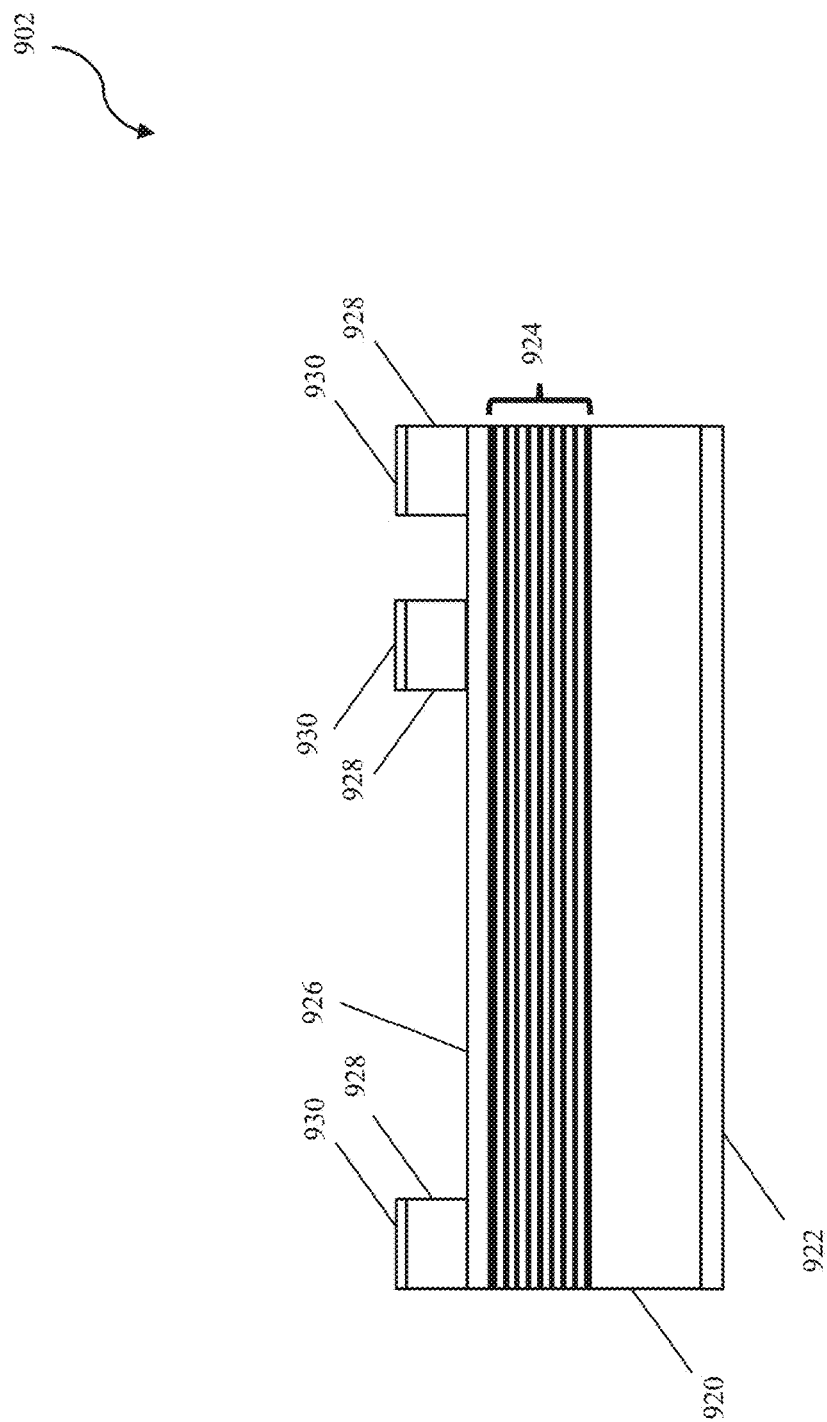
FIG. 9C is a cross-section of a mask, in accordance with some embodiments

Referring now to the example of FIG. 9C, illustrated therein is an example cross-section of the EUV mask 902 of FIG. 9A. As shown in FIG. 9C, the EUV mask 902 may include a substrate 920 having a backside coating layer 922, a multi-layer structure 924, a capping layer 926, and one or more absorbers 928 having an anti-reflective coating (ARC) layer 930. In some embodiments, the substrate 920 includes a low thermal expansion material (LTEM) substrate (e.g., such as $TiO_2$ doped $SiO_2$), and the backside coating layer 922 includes a chromium nitride ($Cr_xN_y$) layer. In some examples, substrate 920 has a thickness of about 6.3 to 6.5 mm. In some examples, the backside coating 922 has a thickness of about 70-100 nm. By way of example, the multi-layer structure 924 may include molybdenum-silicon (Mo—Si) multi-layers deposited on top of the substrate 920 for example, using an ion deposition technique. In some embodiments, the multi-layer structure 924 has a thickness of about 250-350 nm, and in some examples each Mo—Si layer pair has a thickness of about 3 nm (for the Mo layer) and about 4 nm (for the Si layer). In various embodiments, the capping layer 926 includes a ruthenium (Ru) capping layer, which in some examples may have a thickness of about 2.5 nm. In some embodiments, the capping layer 926 may include a Si capping layer having a thickness of about 4 nm. The capping layer 926 may help to protect the multi-layer structure 924 (e.g., during fabrication of the EUV mask 902) and may also serve as an etch-stop layer for a subsequent absorber layer etch process. In some embodiments, the absorbers 928 may include for example, a $Ta_xN_y$ layer or a $Ta_xB_yO_zN_u$ layer, which may have a thickness of about 50-75 nm and are configured to absorb EUV light (e.g., with a wavelength of about 13.5 nm). In some examples, other materials may be used for the absorbers 928, such as Al, Cr, Ta, and W, among others. In some examples, the ARC layer 930 includes at least one of a $Ta_xB_yO_zN_u$ layer, a $Hf_xO_y$ layer, or a $Si_xO_yN_z$ layer. While some examples of materials that may be used for each of the substrate 920, the backside coating layer 922, the multi-layer structure 924, the capping layer 926, the absorbers 928, and the ARC layer 930 have been given, it will be understood that other suitable materials as known in the art may be equally used without departing from the scope of the present disclosure.

For purposes of illustration, an exemplary fabrication method for the EUV mask 902 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the EUV mask 902. In some embodiments, an ARC layer may be deposited over the absorber layer prior to patterning the mask blank. The patterned EUV mask 902 may then be used to transfer circuit and/or device patterns onto a semiconductor wafer. In various embodiments, the patterns defined by the EUV mask 902 can be transferred over and over onto multiple wafers through various lithography processes. In addition, a set of masks (such as the EUV mask 902) may be used to construct a complete integrated circuit (IC) device and/or circuit.

In various embodiments, the EUV mask 902 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 1016. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the EUV mask 902 may include a PSM which utilizes interference produced by phase differences of light passing therethrough. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask.

As described above, the EUV mask 902 includes a patterned image that may be used to transfer circuit and/or device patterns onto a semiconductor wafer (e.g., the semiconductor substrate 1016) by the lithography system 1000. To achieve a high fidelity pattern transfer from the patterned EUV mask 902 to the semiconductor substrate 1016, the lithography process should be defect free. Particles may be unintentionally deposited on the surface of the capping layer 926 and can result in degradation of lithographically transferred patterns if not removed. Particles may be introduced by any of a variety of methods such as during CMP, a cleaning process, and/or during handling of the EUV mask 902. As shown in FIG. 9A, a pellicle assembly 600 mounted on the EUV mask 902 protects the EUV mask 902 from fallen particles and keeps the particles out of focus so that they do not produce a patterned image.

Referring now to FIG. 1 and FIG. 10, in an embodiment, the method 100 then proceeds to block 120, where the mask-pellicle system 900 is loaded to a lithography system.

Illustrated in FIG. 10 is a schematic view of a lithography system 1000, in accordance with some embodiments. The lithography system 1000 may also be generically referred to as a scanner that is operable to perform lithographic processes including exposure with a respective radiation source and in a particular exposure mode. In at least some of the present embodiments, the lithography system 1000 includes an extreme ultraviolet (EUV) lithography system designed to expose a resist layer by EUV light. Inasmuch, in various embodiments, the resist layer includes a material sensitive to the EUV light (e.g., an EUV resist). The lithography system 1000 of FIG. 10 includes a plurality of subsystems such as a radiation source 1002, an illuminator 1004, a mask stage 1006 configured to receive a EUV mask 902, projection optics 1010, and a substrate stage 1018 configured to receive a semiconductor substrate 1016. A general description of the operation of the lithography system 1000 may be given as follows: EUV light from the radiation source 1002 is directed toward the illuminator 1004 (which includes a set of reflective mirrors) and projected onto the reflective EUV mask 902. A reflected mask image is directed toward the projection optics 1010, which focuses the EUV light and projects the EUV light onto the semiconductor substrate 1016 to expose an EUV resist layer deposited thereupon. Additionally, in various examples, each subsystem of the lithography system 1000 may be housed in, and thus operate within, a high-vacuum environment, for example, to reduce atmospheric absorption of EUV light.

In the embodiments described herein, the radiation source 1002 may be used to generate the EUV light. In some embodiments, the radiation source 1002 includes a plasma source, such as for example, a discharge produced plasma (DPP) or a laser produced plasma (LPP). In some examples, the EUV light may include light having a wavelength ranging from about 1 nm to about 900 nm. In one particular example, the radiation source 1002 generates EUV light with a wavelength centered at about 13.5 nm. Accordingly, the radiation source 1002 may also be referred to as an EUV radiation source 1002. In some embodiments, the radiation source 1002 also includes a collector, which may be used to collect EUV light generated from the plasma source and to direct the EUV light toward imaging optics such as the illuminator 1004.

As described above, light from the radiation source 1002 is directed toward the illuminator 1004. In some embodiments, the illuminator 1004 may include reflective optics (e.g., for the EUV lithography system 1000), such as a single mirror or a mirror system having multiple mirrors in order to direct light from the radiation source 1002 onto the mask stage 1006, and particularly to the mask-pellicle system 900 secured on the mask stage 1006. In some examples, the illuminator 1004 may include a zone plate, for example, to improve focus of the EUV light. In some embodiments, the illuminator 1004 may be configured to shape the EUV light passing therethrough in accordance with a particular pupil shape, and including for example, a dipole shape, a quadrupole shape, an annular shape, a single beam shape, a multiple beam shape, and/or a combination thereof. In some embodiments, the illuminator 1004 is operable to configure the mirrors (i.e., of the illuminator 1004) to provide a desired illumination to the EUV mask 902. In one example, the mirrors of the illuminator 1004 are configurable to reflect EUV light to different illumination positions. In some embodiments, a stage prior to the illuminator 1004 may additionally include other configurable mirrors that may be used to direct the EUV light to different illumination positions within the mirrors of the illuminator 1004. In some embodiments, the illuminator 1004 is configured to provide an on-axis illumination (ONI) to the EUV mask 902. In some embodiments, the illuminator 1004 is configured to provide an off-axis illumination (OAI) to the EUV mask 902. It should be noted that the optics employed in the EUV lithography system 1000, and in particular optics used for the illuminator 1004 and the projection optics 1010, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 1000 also includes the mask stage 1006 configured to secure the mask-pellicle system 900, which includes a pellicle assembly 600 and a EUV mask 902. Since the lithography system 1000 may be housed in, and thus operate within, a high-vacuum environment, the mask stage 1006 may include an electrostatic chuck (e-chuck) to secure the mask system 900 (including an EUV mask 902 and a pellicle assembly 600). As with the optics of the EUV lithography system 1000, the EUV mask 902 is also reflective. As illustrated in the example of FIG. 10, light is reflected from the EUV mask 902 and directed towards the projection optics 1010, which collects the EUV light reflected from the EUV mask 902. By way of example, the EUV light collected by the projection optics 1010 (reflected from the EUV mask 902) carries an image of the pattern defined by the EUV mask 902. In various embodiments, the projection optics 1010 provides for imaging the pattern of the EUV mask 902 onto the semiconductor substrate 1016 secured on the substrate stage 1018 of the lithography system 1000. In particular, in various embodiments, the projection optics 1010 focuses the collected EUV light and projects the EUV light onto the semiconductor substrate 1016 to expose an EUV resist layer deposited on the semiconductor substrate 1016. As described above, the projection optics 1010 may include reflective optics, as used in EUV lithography systems such as the lithography system 1000. In some embodiments, the illuminator 1004 and the projection optics 1010 are collectively referred to as an optical module of the lithography system 1000.

In some embodiments, the lithography system 1000 also includes a pupil phase modulator 1012 to modulate an optical phase of the EUV light directed from the EUV mask 902, such that the light has a phase distribution along a projection pupil plane 1014. In some embodiments, the pupil phase modulator 1012 includes a mechanism to tune the reflective mirrors of the projection optics 1010 for phase modulation. For example, in some embodiments, the mirrors of the projection optics 1010 are configurable to reflect the EUV light through the pupil phase modulator 1012, thereby modulating the phase of the light through the projection optics 1010. In some embodiments, the pupil phase modulator 1012 utilizes a pupil filter placed on the projection pupil plane 1014. By way of example, the pupil filter may be employed to filter out specific spatial frequency components of the EUV light reflected from the EUV mask 902. In some embodiments, the pupil filter may serve as a phase pupil filter that modulates the phase distribution of the light directed through the projection optics 1010.

Referring now to FIG. 1, in an embodiment, the method 100 then proceeds to block 122, where a wafer is loaded to a lithography system. Referring to the example of FIG. 10, as discussed above, the lithography system 1000 also includes the substrate stage 1018 to secure a semiconductor substrate 1016 to be patterned. In various embodiments, the semiconductor substrate 1016 includes a semiconductor wafer, such as a silicon wafer, germanium wafer, silicon-germanium wafer, III-V wafer, or other type of wafer as known in the art. The semiconductor substrate 1016 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm2. In the embodiments described herein, the various subsystems of the lithography system 1000, including those described above, are integrated and are operable to perform lithography exposing processes including EUV lithography processes. To be sure, the lithography system 1000 may further include other modules or subsystems which may be integrated with (or be coupled to) one or more of the subsystems or components described herein. The method 100 then proceeds to block 124, where a lithography exposure process transfers the pattern on the EUV mask 902 to the semiconductor wafer.

Additional steps can be provided before, during, and after the method 100, and some of the steps described can be replaced, eliminated, or moved around for additional embodiments of the method 100. In one example, the lithography exposure process includes soft baking, mask aligning, exposing, post-exposure baking, developing photoresist, and hard baking.

Thus, the present disclosure provides methods and structures for fabrication of a EUV pellicle assembly that offers various advantages. It is understood, however, that not all advantages are necessarily discussed herein, and other embodiments may offer different advantages, and that no particular advantage is required for all embodiments. In some embodiments, the EUV pellicle assembly fabrication method and related structures described herein do not employ a lithography process, which reduces the damage to the pellicle membrane caused by stress produced by multiple processes (e.g., complicated dry and wet etch processes) included in the lithography process. In some embodiments, the EUV pellicle assembly fabrication method employs a carrier and a release layer to secure the membrane layer, which allows handling of the pellicle membrane layer by handling the carrier, and reduces the risk of damaging the membrane layer that may be caused by stresses caused by transportation and/or subsequent fabrication steps. In some embodiments, the EUV pellicle assembly fabrication method employs a pellicle frame fabrication process where a pellicle frame is fabricated without the handling of a pellicle membrane attached to the pellicle frame, which increases reliability and overall yield of the pellicle frame fabrication process. Those skilled in the art will recognize other benefits and advantages of the methods and devices as described herein, and the embodiments described are not meant to be limiting beyond what is specifically recited in the claims that follow.

Thus, the present disclosure provides an embodiment of a method of fabricating a pellicle assembly for a lithography process. The method includes forming a release layer over a carrier. A membrane layer is fabricated over the release layer. A pellicle frame is attached to the membrane layer. After the pellicle frame is attached to the membrane layer, a release treatment process is performed to the release layer to separate the carrier from the membrane layer. A pellicle assembly including the pellicle frame and the membrane layer attached to the pellicle frame is formed. In some examples, a protective layer is deposited over the release layer prior to fabricating the membrane layer, and the membrane layer is fabricated over the protective layer. In some examples, after the release treatment process is performed, the protective layer is removed to form the pellicle assembly.

The present disclosure also provides an embodiment of a method for fabricating a pellicle assembly for a lithography process. The method includes receiving a pellicle frame. A membrane holder is formed by forming a release layer over a carrier, depositing a protective layer over the release layer, and fabricating a membrane layer over the protective layer, wherein a first surface of the membrane layer physically contacts a top surface of the protective layer. The pellicle frame is bonded to the membrane holder with a frame adhesive interposed between the pellicle frame and a second surface of the membrane layer. A release treatment process is performed to the release layer to remove the carrier from the protective layer. The protective layer is removed to form a pellicle assembly, which includes the membrane layer and the pellicle frame attached to the second surface of the membrane layer. In some examples, the protective layer is removed to expose the first surface of the membrane layer, and the pellicle assembly has a top surface formed by the exposed first surface of the membrane layer.

The present disclosure further provides an embodiment of a method of forming a mask-pellicle system. The method includes providing a mask with an integrated circuit (IC) design layout and receiving a pellicle frame having a top surface and a bottom surface. A membrane holder is fabricated. The membrane holder includes a release layer disposed over a carrier, a protective layer disposed over the release layer, and a membrane layer disposed over the protective layer. The top side of the pellicle frame is attached to the membrane layer of the membrane holder using a frame adhesive. A treatment process is performed to the release layer to remove the release layer and the carrier from the membrane holder. The protective layer is removed from the membrane holder and a pellicle assembly including the membrane layer and the pellicle frame is formed. The mask is mounted to the bottom surface of the pellicle frame to form a mask-pellicle system including the pellicle assembly and the mask.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a pellicle assembly for a lithography process, comprising:
   providing a carrier;
   fabricating a membrane layer over a release layer over the carrier,
      wherein the release layer includes a first material having foaming properties when treated by a release treatment process;
   attaching a pellicle frame to the membrane layer; and
   after attaching the pellicle frame to the membrane layer, separating the carrier from the membrane layer using the release treatment process.

2. The method of claim 1, further comprising:
   forming the release layer over the carrier using spin coating or chemical vapor deposition (CVD).

3. The method of claim 2, further comprising:
   prior to the fabricating the membrane layer, depositing a protective layer over the release layer; and
   after the separating the carrier from the membrane layer, removing the protective layer from the membrane layer.

4. The method of claim 3,
wherein the removing the protective layer further includes exposing a second surface of the membrane layer,
wherein the pellicle assembly has a top surface formed by the exposed second surface of the membrane layer.

5. The method of claim 4, wherein the second surface of the membrane layer is a bottom surface of a bottom layer of the membrane layer.

6. The method of claim 3, wherein the fabricating the membrane layer includes:
depositing a bottom layer of the membrane layer over the protective layer, wherein a bottom surface of the bottom layer physically contacts the protective layer;
forming a middle layer of the membrane layer over the bottom layer; and
fabricating a top layer of the membrane layer over the middle layer.

7. The method of claim 1, wherein the separating the carrier from the membrane layer includes:
performing the release treatment process to the release layer to cause foaming of the first material to separate the carrier from the membrane layer.

8. A method, comprising:
providing a carrier;
forming a release layer including a first material over the carrier, wherein the first material has foaming properties when treated by a release treatment process;
fabricating a membrane layer over the release layer over the carrier;
attaching a pellicle frame to the membrane layer;
after attaching the pellicle frame to the membrane layer, separating the carrier from the membrane layer using the release treatment process; and
mounting the pellicle frame to a mask to form a mask-pellicle system including the membrane layer, the pellicle frame, and the mask.

9. The method of claim 8, further comprising:
forming the release layer over the carrier using spin coating or chemical vapor deposition (CVD).

10. The method of claim 9, wherein the first material includes foaming particles.

11. The method of claim 8, wherein the separating the carrier from the membrane layer includes:
performing the release treatment process to the release layer to cause expansion of the first material.

12. The method of claim 8, wherein the performing the release treatment process further includes:
applying laser irradiation to the release layer.

13. The method of claim 8, further comprising:
depositing a protective layer over the release layer;
wherein the membrane layer is fabricated over the protective layer.

14. The method of claim 13, wherein a first surface of the membrane layer physically contacts a top surface of the protective layer, further comprising:
bonding the pellicle frame to the membrane layer with a frame adhesive interposed between the pellicle frame and a second surface of the membrane layer.

15. The method of claim 14, further comprising:
after the separating the carrier from the membrane layer, removing the protective layer to form a pellicle assembly, wherein the pellicle assembly includes the membrane layer and the pellicle frame attached to the second surface of the membrane layer.

16. The method of claim 8, wherein the attaching the pellicle frame to the membrane layer further includes:
disposing the pellicle frame directly over a first portion of a first surface of the membrane layer; and
defining a second portion of the first surface of the membrane layer with an opening formed by sidewalls of the pellicle frame.

17. The method of claim 16, wherein the mask-pellicle system includes an internal space formed at least by the second portion of the first surface of the membrane layer and interior surfaces of sidewalls of the pellicle frame.

18. A method, comprising:
providing a mask with an integrated circuit (IC) design layout;
receiving a pellicle frame having a top surface and a bottom surface;
fabricating a membrane holder including:
a protective layer disposed over a release layer, wherein the release layer is disposed over a carrier and includes a first material having foaming properties when treated by a release treatment process, and
a membrane layer disposed over the protective layer;
attaching the top surface of the pellicle frame to a first surface of the membrane layer of the membrane holder using a frame adhesive;
after attaching the top surface of the pellicle frame to the first surface of the membrane layer of the membrane holder, separating the carrier from the membrane holder using a release treatment process;
removing the protective layer from the membrane holder, thereby forming a pellicle assembly including the membrane layer and the pellicle frame; and
mounting the bottom surface of the pellicle frame to the mask to form a mask-pellicle system including the pellicle assembly and the mask.

19. The method of claim 18, wherein the fabricating the membrane holder includes fabricating a release layer over the carrier using spin coating or chemical vapor deposition (CVD) spin.

20. The method of claim 18, wherein the mask-pellicle system includes an internal space formed at least by an exposed portion of the first surface of the membrane layer and sidewalls of the pellicle frame.

* * * * *